United States Patent
Saiki et al.

(10) Patent No.: US 12,483,127 B2
(45) Date of Patent: Nov. 25, 2025

(54) POWER SUPPLY MODULATOR AND POWER SUPPLY MODULATION TYPE AMPLIFIER

(71) Applicant: Mitsubishi Electric Corporation, Tokyo (JP)

(72) Inventors: Kento Saiki, Tokyo (JP); Shuichi Sakata, Tokyo (JP); Yuji Komatsuzaki, Tokyo (JP); Shintaro Shinjo, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 617 days.

(21) Appl. No.: 17/890,609

(22) Filed: Aug. 18, 2022

(65) Prior Publication Data

US 2022/0407416 A1    Dec. 22, 2022

Related U.S. Application Data

(63) Continuation of application No. PCT/JP2020/016017, filed on Apr. 9, 2020.

(51) Int. Cl.
*H03F 3/20* (2006.01)
*H02M 3/155* (2006.01)

(52) U.S. Cl.
CPC .............. *H02M 3/155* (2013.01); *H03F 3/20* (2013.01); *H03F 2200/165* (2013.01)

(58) Field of Classification Search
CPC .......... H02M 3/155; H02M 1/08; H03F 3/20; H03F 2200/165; H03F 2200/451;
(Continued)

(56) References Cited

U.S. PATENT DOCUMENTS 10,447,159 B2 * 10/2019 Gatard ............... H03K 17/6871
2005/0140426 A1    6/2005 Fujiwara
(Continued)

FOREIGN PATENT DOCUMENTS

| JP | 2005-192302 A | 7/2005 |
| JP | 2014-3582 A | 1/2014 |
| JP | 2019-80300 A | 5/2019 |

OTHER PUBLICATIONS

International Search Report (PCT/ISA/210) issued in PCT/JP2020/016017, dated Jun. 30, 2020.
(Continued)

*Primary Examiner* — Hieu P Nguyen
(74) *Attorney, Agent, or Firm* — Birch, Stewart, Kolasch & Birch, LLP

(57) ABSTRACT

A power supply modulator includes: a first switching element in which a first voltage is applied to the first terminal and the second terminal is connected to an output terminal; a second switching element in which the third terminal is connected to the output terminal and the second terminal, and a second voltage is applied to the fourth terminal; a first driver circuit in which the first voltage is applied to the fifth terminal and the sixth terminal is grounded, to control opening and closing of the first switching element by a change in a resistance value between the fifth and sixth terminals; and a second driver circuit in which the seventh terminal is grounded and the second voltage is applied to the eighth terminal, to control opening and closing of the second switching element by a change in a resistance value between the seventh and eighth terminals.

2 Claims, 8 Drawing Sheets

(58) Field of Classification Search
CPC .. H03F 2200/504; H03F 1/0216; H03F 3/195; H03F 3/245; H03F 3/2171; H03K 17/145
USPC ................. 330/199, 251, 207 A, 10, 297
See application file for complete search history.

(56) References Cited

U.S. PATENT DOCUMENTS

2015/0084691 A1  3/2015  Hori
2019/0123689 A1  4/2019  Ha et al.

OTHER PUBLICATIONS

Shinjo et al., "High Speed, High Analog Bandwidth Buck Converter Using GaN HEMTs for Envelope Tracking Power Amplifier Applications," 2013 IEEE Topical Conference on Wireless Sensors and Sensor Networks, Jan. 20-23, 2013, pp. 13-15.
Written Opinion of the International Searching Authority (PCT/ISA/237) issued in PCT/JP2020/016017, dated Jun. 30, 2020.

* cited by examiner

POWER SUPPLY MODULATOR AND POWER SUPPLY MODULATION TYPE AMPLIFIER

CROSS REFERENCE TO RELATED APPLICATIONS

This application is a Continuation of PCT International Application No. PCT/JP2020/016017, filed on Apr. 9, 2020, which is hereby expressly incorporated by reference into the present application.

TECHNICAL FIELD

The present disclosure relates to a power supply modulator and a power supply modulation type amplifier including a power supply modulator.

BACKGROUND ART

A power supply modulation type amplifier may include a power supply modulator that changes the bias voltage of a power amplifier in accordance with the signal level of a high frequency signal.

A power supply modulator disclosed in the following Nonpatent Literature 1 includes a first transistor, a second transistor, a third transistor and a fourth transistor.

A first voltage which is a positive voltage is applied to the drain terminal of the first transistor. The source terminal of the first transistor is connected to an output terminal. The drain terminal of the second transistor is connected to each of the following terminals: the source terminal of the first transistor and the output terminal. The source terminal of the second transistor is grounded.

To the drain terminal of the third transistor, a second voltage which is a positive voltage is applied via a resistor. Further, the drain terminal of the third transistor is connected to the gate terminal of the first transistor. To the source terminal of the third transistor, a fifth voltage which is a negative voltage is applied. To the drain terminal of the fourth transistor, a fourth voltage which is a positive voltage is applied via a resistor. Further, the drain terminal of the fourth transistor is connected to the gate terminal of the second transistor. To the source terminal of the fourth transistor, the fifth voltage which is a negative voltage is applied.

CITATION LIST

Nonpatent Literature

Nonpatent Literature 1: S. Shinjo, et. al, "High Speed High Analog Bandwidth Buck Converter Using GaN HEMTs for Envelope Tracking Power Amplifier Applications," 2013 IEEE Topical Conference on Wireless Sensors and Sensor Networks

SUMMARY OF INVENTION

Technical Problem

A problem is that in order to drive the power supply modulator disclosed in Nonpatent Literature 1, an external power supply circuit needs to include five power supplies so as to provide each of the first, second, third, fourth and fifth voltages for the power supply modulator.

The present disclosure is made in order to solve the above-mentioned problem, and it is therefore an object of the present disclosure to obtain a power supply modulator that makes it possible to reduce the number of power supplies which an external power supply circuit includes to smaller than five.

Solution to Problem

A power supply modulator according to the present disclosure includes: a first switching element having a first terminal and a second terminal, a first voltage being applied to the first terminal and the second terminal being connected to an output terminal; a second switching element having a third terminal and a fourth terminal, the third terminal being connected to each of the following terminals: the output terminal and the second terminal, and a second voltage lower than the first voltage being applied to the fourth terminal; a first driver circuit having a fifth terminal and a sixth terminal, the first voltage being applied to the fifth terminal and the sixth terminal being grounded, to control opening and closing of the first switching element by means of a change in a value of resistance between the fifth terminal and the sixth terminal, the change depending on a signal level of a pulse width modulation signal; and a second driver circuit having a seventh terminal and an eighth terminal, the seventh terminal being grounded and the second voltage being applied to the eighth terminal, to control opening and closing of the second switching element by means of a change in a value of resistance between the seventh terminal and the eighth terminal, the change depending on a signal level of an inverted signal of the pulse width modulation signal.

The first switching element is a first transistor, the first terminal is a drain terminal of the first transistor, and the second terminal is a source terminal of the first transistor; the second switching element is a second transistor, the third terminal is a drain terminal of the second transistor, and the fourth terminal is a source terminal of the second transistor; the first driver circuit is a third transistor, the pulse width modulation signal is applied to a gate terminal of the third transistor, the fifth terminal is a drain terminal of the third transistor, and the drain terminal of the third transistor is connected to a gate terminal of the first transistor, and the sixth terminal is a source terminal of the third transistor; and the second driver circuit is a fourth transistor, the inverted signal of the pulse width modulation signal is applied to a gate terminal of the fourth transistor, the seventh terminal is a source terminal of the fourth transistor, and the eighth terminal is a drain terminal of the fourth transistor, and the drain terminal of the fourth transistor is connected to a gate terminal of the second transistor.

The power supply modulator also includes: a first resistor of which a first end is connected to each of the following terminals: the gate terminal of the first transistor and the drain terminal of the third transistor; a diode in which a cathode terminal is connected to a second end of the first resistor, and a third voltage is applied to an anode terminal; a capacitor of which a first end is connected to each of following parts: the second end of the first resistor and the cathode terminal of the diode, and of which a second end is connected to the source terminal of the first transistor; and a second resistor of which a first end is connected to each of the following terminals: the gate terminal of the second transistor and the drain terminal of the fourth transistor, and of which a second end is connected to the source terminal of the second transistor.

Advantageous Effects of Invention

According to the present disclosure, the number of power supplies which an external power supply circuit includes can be reduced to smaller than five.

DESCRIPTION OF EMBODIMENTS

Hereinafter, in order to explain the present disclosure in greater detail, embodiments of the present disclosure will be explained with reference to the accompanying drawings.

Embodiment 1

Figure 1:
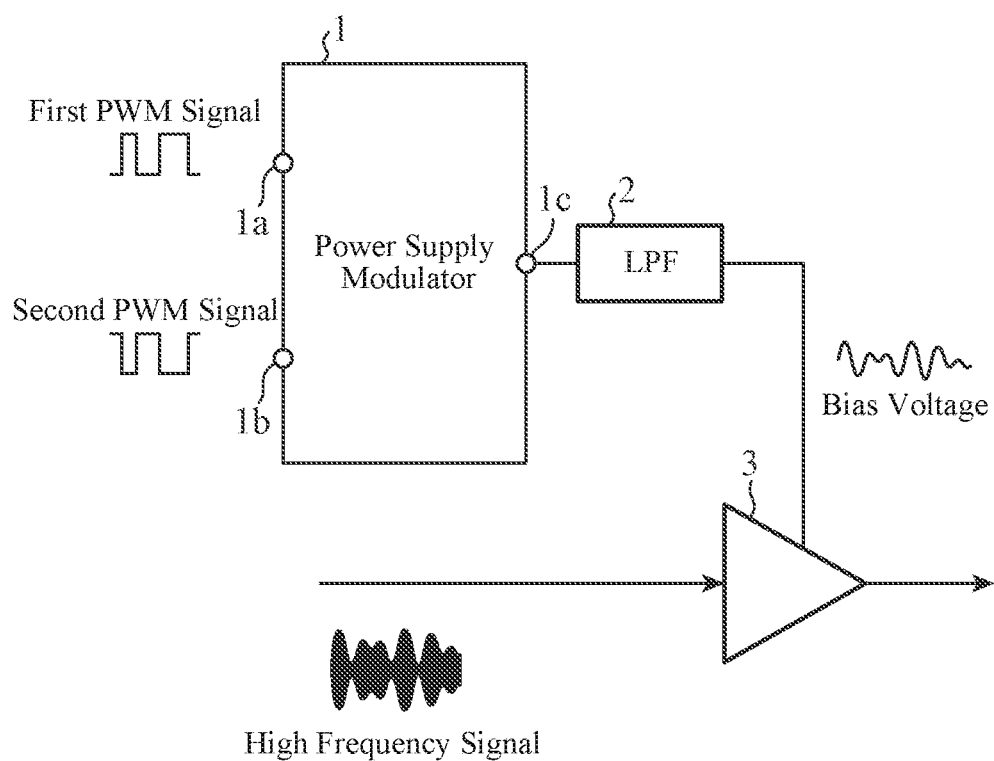
FIG. 1 is a schematic diagram showing a power supply modulation type amplifier including a power supply modulator 1 according to Embodiment 1.

FIG. 1 is a schematic diagram showing a power supply modulation type amplifier including a power supply modulator 1 according to Embodiment 1.

The power supply modulation type amplifier shown in FIG. 1 includes the power supply modulator 1, a low pass filter (referred to as an "LPF" hereinafter) 2, and a power amplifier 3.

To an input terminal 1a, a first pulse width modulation signal (referred to as "PWM signal" hereinafter) associated with a high frequency signal which is an object to be amplified is supplied from the outside.

To an input terminal 1b, a second PWM signal associated with the high frequency signal which is an object to be amplified is supplied from the outside.

The first pulse width modulation signal has a duty ratio which increases with increase in the amplitude of the high frequency signal.

The second PWM signal is an inverted signal of the first pulse width modulation signal.

The power supply modulator 1 is a device that changes the bias voltage of the power amplifier 3 in accordance with each of the signal levels of the first and second PWM signals.

An output terminal 1c is one via which the output voltage of the power supply modulator 1 is outputted to the LPF 2.

The LPF 2 generates the bias voltage by removing higher harmonics etc. which are included in the voltage outputted from the output terminal 1c of the power supply modulator 1, and provides the bias voltage for the power amplifier 3.

The power amplifier 3 amplifies the high frequency signal hick is an object to be amplified, using the bias voltage outputted from the LPF 2.

Figure 2:
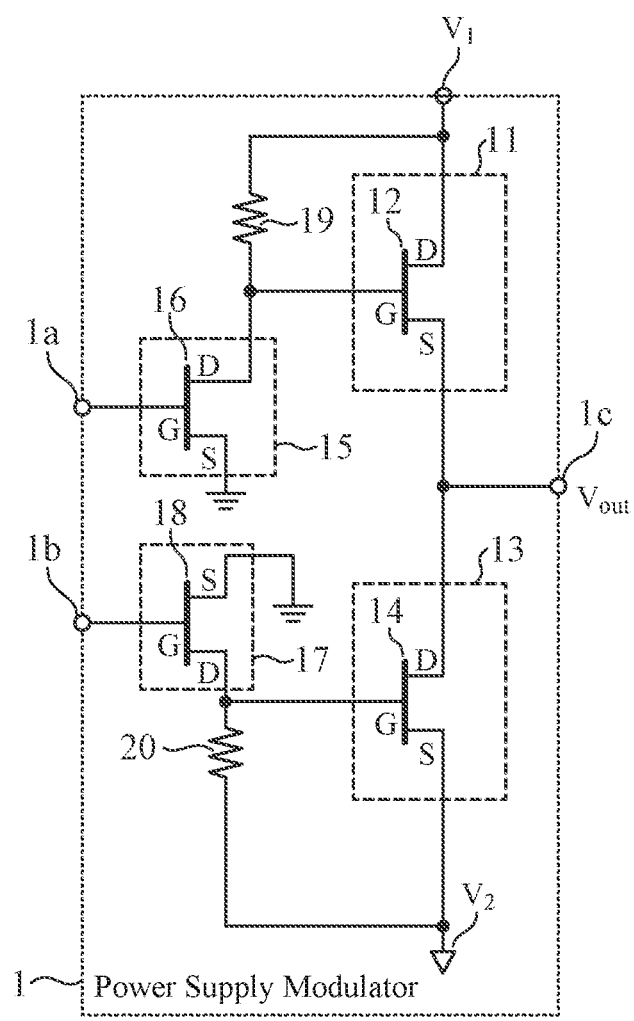
FIG. 2 is a schematic diagram showing the power supply modulator 1 according to Embodiment 1.

FIG. 2 is a schematic diagram showing the power supply modulator 1 according to Embodiment 1.

The power supply modulator 1 includes a first switching element 11, a second switching element 13, a first driver circuit 15, a second driver circuit 17, a first resistor 19 and a second resistor 20.

The first switching element 11 has a first terminal and a second terminal.

A first voltage $V_1$ is applied to the first terminal of the first switching element 11. The second terminal of the first switching element 11 is connected to each of the following terminals: the output terminal 1c and a third terminal of the second switching element 13. The first voltage $V_1$ is provided from an external power supply circuit not illustrated.

In the power supply modulator 1 shown in FIG. 2, the first switching element 11 is implemented by a first transistor 12.

The first terminal of the first switching element 11 is the drain terminal of the first transistor 12. The second terminal of the first switching element 11 is the source terminal of the first transistor 12.

To the drain terminal of the first transistor 12, the first voltage $V_1$ is applied. The source terminal of the first transistor 12 is connected to each of the following terminals: the drain terminal of a second transistor 14, which will be mentioned later, and the output terminal 1c.

The gate terminal of the first transistor 12 is connected to each of the following terminals: the drain terminal of a third transistor 16, which will be mentioned later, and an end of the first resistor 19.

In the power supply modulator 1 shown in 2, the first switching element 11 is implemented by the first transistor 12. However, this is only an example, and the first switching element 11 may be implemented by, for example, an open-close switch.

The second switching element 13 has the third terminal and a fourth terminal. The third terminal of the second switching element 13 is connected to each of the following terminals: the output terminal 1c and the second terminal of the first switching element 11. To the fourth terminal of the second switching element 13, a second voltage $V_2$ lower than the first voltage $V_1$ is applied. The second voltage $V_2$ is provided from an external power supply circuit not illustrated.

In the power supply modulator 1 shown in FIG. 2., the second switching element 13 is implemented by the second transistor 14.

The third terminal of the second switching element 13 is the drain terminal of the second transistor 14. The fourth terminal of the second switching element 13 is the source terminal of the second transistor 14.

The drain terminal of the second transistor 14 is connected to each of the following terminals: the source terminal of the first transistor 12 and the output terminal 1c.

To the source terminal of the second transistor 14, the second voltage $V_2$ is applied.

The gate terminal of the second transistor 14 is connected to each of the following terminals: the drain terminal of a fourth transistor 18, which is not illustrated, and an end of the second resistor 20.

In the power supply modulator 1 shown in FIG. 2, the second switching element 13 is implemented by the second transistor 14. However, this is only an example, and the second switching element 13 may be implemented by, for example, an open-close switch.

The first driver circuit 15 has a fifth terminal and a sixth terminal. To the fifth terminal of the first driver circuit 15, the first voltage $V_1$ is applied via the first resistor 19. The sixth terminal of the first driver circuit 15 is grounded.

The first driver circuit 15 controls the opening and closing of the first switching element 11 by means of a change in the value of resistance between the fifth terminal and the sixth terminal, the change depending on the signal level of the first PWM signal supplied to the input terminal 1a.

Concretely, when the signal level of the first PWM signal is an H level, the value of the resistance between the fifth terminal and the sixth terminal becomes approximately 0Ω, and thus the first driver circuit 15 places the first switching element 11 in an open state. When the signal level of the first PWM signal is an L level, the value of the resistance between the fifth terminal and the sixth terminal becomes a value to such an extent that a current hardly flows between the fifth terminal and the sixth terminal, and thus the first driver circuit 15 places the first switching element 11 in a closed state.

In the power supply modulator 1 shown in FIG. 2, the first driver circuit 15 is implemented by the third transistor 16.

The fifth terminal of the first driver circuit 15 is the drain terminal of the third transistor 16. The sixth terminal of the first driver circuit 15 is the source terminal of the third transistor 16.

The drain terminal of the third transistor 16 is connected to each of the following terminals: the gate terminal of the first transistor 12, and the end of the first resistor 19.

The source terminal of the third transistor 16 is grounded.

The gate terminal of the third transistor 16 is connected to the input terminal 1a.

In the power supply modulator 1 shown in FIG. 2, the first driver circuit 15 is implemented by the third transistor 16. However, this is only an example, and the first driver circuit 15 may be implemented by, for example, an open-close switch.

Further, in the power supply modulator 1 shown in FIG. 2, the first driver circuit 15 is implemented by the third transistor 16. However, this is only an example, and the first driver circuit 15 may include the third transistor 16 and the first resistor 19.

The second driver circuit 17 has a seventh terminal and an eighth terminal.

The seventh terminal of the second driver circuit 17 is grounded. To the eighth terminal of the second driver circuit 17, the second voltage $V_2$ is applied via the second resistor 20.

The second driver circuit 17 controls the opening and closing of the second switching element 13 by means of a change in the value of resistance between the seventh terminal and the eighth terminal, the change depending on the signal level of the second PWM signal supplied to the input terminal 1b.

Concretely, when the signal level of the second PWM signal is an H level, the value of the resistance between the seventh terminal and the eighth terminal becomes approximately 0Ω, and thus the second driver circuit 17 places the second switching element 13 in an open state.

When the signal level of the second PWM signal is an L level, the value of the resistance between the seventh terminal and the eighth terminal becomes a value to such an extent that a current hardly flows between the seventh terminal and the eighth terminal, and thus the second driver circuit 17 places the second switching element 13 in a closed state.

In the power supply modulator 1 shown in FIG. 2, the second driver circuit 17 is implemented by the fourth transistor 18.

The seventh terminal of the second driver circuit 17 is the source terminal of the fourth transistor 18. The eighth terminal of the second driver circuit 17 is the drain terminal of the fourth transistor 18.

The source terminal of the fourth transistor 18 is grounded. The drain terminal of the fourth transistor 18 is connected to each of the following terminals: the gate terminal of the second transistor 14 and the end of the second resistor 20.

The gate terminal of the fourth transistor 18 is connected to the input terminal 1b.

In the power supply modulator 1 shown in FIG. 2, the second driver circuit 17 is implemented by the fourth transistor 18. However, this is only an example, and the second driver circuit 17 may be implemented by, for example, an open-close switch.

Further, in the power supply modulator 1 shown in FIG. 2, the second driver circuit 17 is implemented by the fourth transistor 18. However, this is only an example, and the second driver circuit 17 may include the fourth transistor 18 and the second resistor 20.

Next, the operation of the power supply modulation type amplifier shown in FIG. 1 will be explained.

When the first PWM signal and the second PWM signal are supplied, the power supply modulator 1 changes the voltage to be outputted from the output terminal 1c to the LPF 2, in accordance with each of the signal levels of the first and second PWM signals.

For example, when the signal level of the first PWM signal is the H level and the signal level of the second PWM signal is the L level, the power supply modulator 1 outputs the second voltage $V_2$ from the output terminal 1c to the LPF 2.

For example, when the signal level of the first PWM signal is the L level and the signal level of the second PWM signal is the H level, the power supply modulator 1 outputs the first voltage $V_1$ from the output terminal 1c to the LPF 2.

Hereinafter, the operation of the power supply modulator 1 will be explained concretely.

The first PWM signal is supplied to the gate terminal of the third transistor 16, and the second PWM signal is supplied to the gate terminal of the fourth transistor 18.

When the signal level of the first PWM signal is the H level, the signal level of the second PWM signal is the L level, whereas when the signal level of the first PWM signal is the L level, the signal level of the second PWM signal is the H level.

When the signal level of the first PWM signal is the H level, the voltage applied to the gate terminal of the third transistor 16 becomes higher than the threshold voltage of the third transistor 16. Therefore, the third transistor 16 enters an on state. The on state of the third transistor 16 is the one in which the value of resistance between the drain and source terminals of the third transistor 16 is approximately 0Ω.

When the third transistor 16 enters the on state, the voltage applied to the gate terminal of the first transistor 12 becomes approximately ground potential. Therefore, because the gate voltage of the first transistor 12 becomes lower than the threshold voltage of the first transistor 12, the first transistor 12 enters an off state (open state).

When the signal level of the second PWM signal is the L level, the voltage applied to the gate terminal of the fourth transistor 18 becomes lower than the threshold voltage of the fourth transistor 18. Therefore, the fourth transistor 18 enters an off state. The off state of the fourth transistor 18 is the one in which the value of resistance between the drain and source terminals of the fourth transistor 18 becomes a value to such an extent that a current hardly flows from the drain terminal toward the source terminal.

When the fourth transistor 18 enters the off state, the second voltage $V_2$ is applied to the gate terminal of the second transistor 14 via the second resistor 20.

Therefore, because the gate voltage of the second transistor 14 becomes higher than the threshold voltage of the second transistor 14, the second transistor 14 enters an on state (closed state).

When the first transistor 12 is in the off state and the second transistor 14 is in the on state, the second voltage $V_2$ is outputted from the output to signal 1c to the LIT Next, then the signal level of the first PWM signal is the L level, the voltage applied to the gate terminal of the third transistor 16 becomes lower than the threshold voltage of the third transistor 16. Therefore, the third transistor 16 enters an off state. The off state of the third transistor 16 is the one in which the value of the resistance between the drain and source terminals of the third transistor 16 becomes a value to such an extent that a current hardly flows from the drain terminal toward the source terminal.

When the third transistor 16 enters the off state, the first voltage $V_1$ is applied to the gate terminal of the first transistor 12 via the first resistor 19. Therefore, because the gate voltage of the first transistor 12 becomes higher than the threshold voltage of the first transistor 12, the first transistor 12 enters an on state (closed state).

When the signal level of the second. PWM signal is the H level, the voltage applied to the gate terminal of the fourth transistor 18 becomes higher than the threshold voltage of the fourth transistor 18. Therefore, the fourth transistor 18 enters an on state. The on state of the fourth transistor 18 is the one in which the value of the resistance between the drain and source terminals of the fourth transistor 18 is approximately 0Ω.

When the fourth transistor 18 enters the on state, the voltage applied to the gate terminal of the second transistor 14 becomes approximately ground potential. Therefore, because the gate voltage of the second transistor 14 becomes lower than the threshold voltage of the second transistor 14, the second transistor 14 enters an off state (open state).

When the first transistor 12 is in the on state and the second transistor 14 is in the off state, the first voltage $V_1$ is outputted from the output terminal 1c to the LPF 2.

The change in each of the signal levels of the first and second PWM signals causes either the first voltage $V_1$ or the second voltage $V_2$ to be outputted from the output terminal 1c to the LPF 2.

The LPF 2 generates the bias voltage by removing higher harmonics etc. which are included in the voltage outputted from the output terminal 1c of the power supply modulator 1, i.e., the first voltage $V_1$ or the second voltage $V_2$, and provides the bias voltage for the power amplifier 3.

The power amplifier 3 amplifies the high frequency signal which is an object to be amplified, using the bias voltage outputted from LPF 2, and outputs the amplified high frequency signal to the outside.

In above-mentioned Embodiment 1, the power supply modulator 1 includes: the first switching element 11 having the first terminal and the second terminal, the first voltage being applied to the first terminal and the second terminal being connected to the output terminal; and the second switching element 13 having the third terminal and the fourth terminal, the third terminal being connected to each of the following terminals: the output terminal and the second terminal, and the second voltage lower than the first voltage being applied to the fourth terminal. The power supply modulator 1 also includes: the first driver circuit 15 having the fifth terminal and the sixth terminal, the first voltage being applied to the fifth terminal and the sixth terminal being grounded, to control the opening and closing of the first switching element 11 by means of a change in the value of the resistance between the fifth terminal and the sixth terminal, the change depending on the signal level of a pulse width modulation signal; and the second driver circuit 17 having the seventh terminal and the eighth terminal, the seventh terminal being grounded and the second voltage being applied to the eighth terminal, to control the opening and closing of the second switching element 13 by means of a change in the value of the resistance between the seventh terminal and the eighth terminal, the change depending on the signal level of an inverted signal of the pulse width modulation signal. Therefore, the power supply modulator 1 makes it possible to reduce the number of power supplies which the external power supply circuit includes to smaller than five.

In the power supply modulator 1 shown in FIG. 2, the drain terminal of the third transistor 16 is connected to the drain terminal of the first transistor 12 via the first resistor 19. However, this is only an example, and the drain terminal of the third transistor 16 may be connected to the source terminal of the first transistor 12 via the first resistor 19, as shown in FIG. 3.

Figure 3:
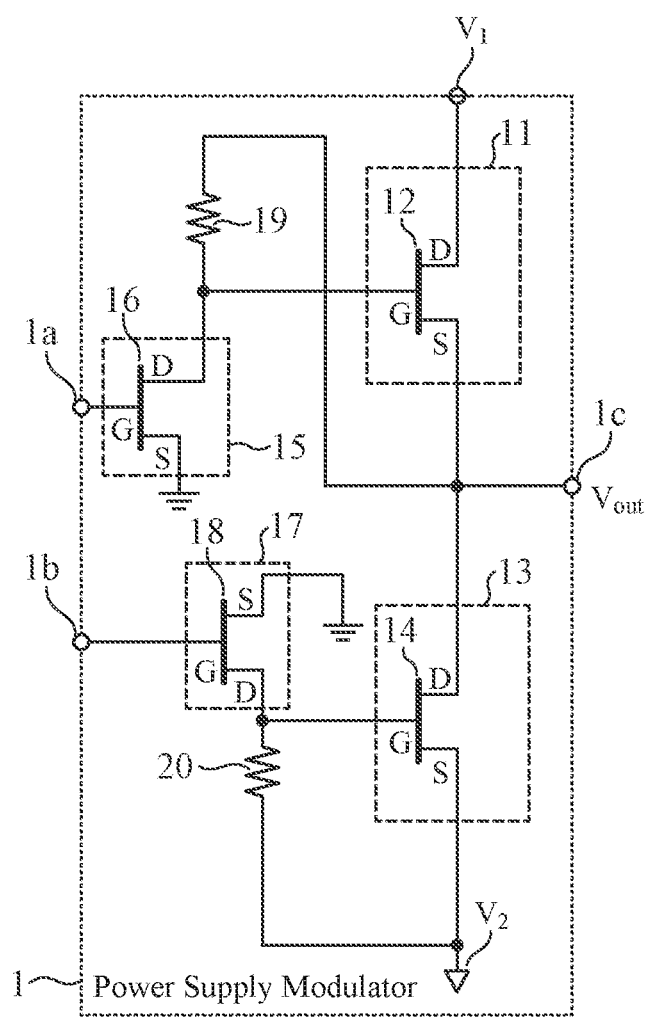
FIG. 3 is a schematic diagram showing another power supply modulator 1 according to Embodiment 1.

Also in the power supply modulator 1 shown in FIG. 3, when the third transistor 16 is in the on state, each of the first and fourth transistors 12 and 18 is in the off state, and the second transistor 14 is in the on state, like in the power supply modulator 1 shown in FIG. 2.

Further, when the third transistor 16 is in the off state, each of the first and fourth transistors 12 and 18 is in the on state, and the second transistor 14 is in the off state.

FIG. 3 is a schematic diagram showing another power supply modulator 1 according to Embodiment 1.

However, the timing at which a first transistor 12 of the power supply modulator 1 shown in FIG. 3 changes from an off state to an on state differs from the timing at which the first transistor 12 of the power supply modulator 1 shown in FIG. 2 changes from the off state to the on state.

More specifically, the first transistor 12 of the power supply modulator 1 shown in FIG. 2 enters the on state when the third transistor 16 enters the off state.

The first transistor 12 of the power supply modulator 1 shown in FIG. 3 changes to the on state at the timing shown below.

First, when the first transistor 12 is in the off state, a second transistor 14 is in an on state, and a third transistor 16 is in an on state, a second voltage $V_2$ is applied to a first resistor 19. When the second transistor 14 changes to an off state and the third transistor 16 changes to an off state, the voltage applied to the first resistor 19 decreases toward 0 V. When the drain and source voltages of the first transistor 12 become equal while the voltage applied to the first resistor 19 is decreasing, the first transistor 12 enters the on state.

Embodiment 2

In Embodiment 2, a power supply modulator 1 including a diode 21 and a capacitor 22 will be explained.

Figure 4:
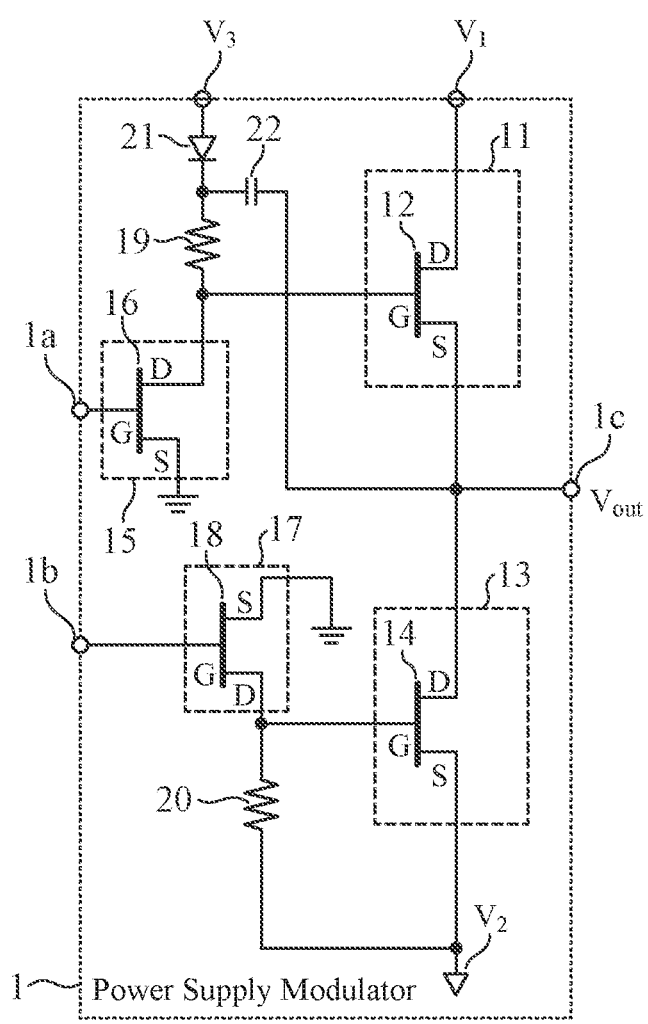
FIG. 4 is a schematic diagram showing a power supply modulator 1 according to Embodiment 2.

FIG. 4 is a schematic diagram showing the power supply modulator 1 according to Embodiment 2. In FIG. 4, because the same reference signs as those shown in FIGS. 2 and 3 denote the same components or like components as those shown in FIGS. 2 and 3, an explanation of the components will be omitted hereinafter.

To the anode terminal of the diode 21, a third voltage $V_3$ is applied. The third voltage $V_3$ is provided from an external power supply circuit not illustrated. The cathode terminal of the diode 21 is connected to each of the following parts: another end of a first resistor 19 and an end of the capacitor 22.

The end of the capacitor 22 is connected to each of the following parts: the other end of the first resistor 19 and the cathode terminal of the diode 21.

The other end of the capacitor is connected to each of the following terminals: the source terminal of a first transistor 12, the drain terminal of a second transistor 14, and an output terminal 1c.

Next, the operation of the power supply modulator 1 shown in FIG. 4 will be explained.

Because this power supply modulator 1 is the same as the power supply modulator 1 shown in FIG. 3, except for the diode 21 and the capacitor 22, only the operations of the diode 21 and the capacitor 22 will be explained hereinafter.

Because the third voltage $V_3$ is applied to the anode terminal of the diode 21, a current flows into the second transistor 14 via the diode 21 and the capacitor 22 when the first transistor 12 is in an off state and the second transistor 14 is in an on state. At this time, the capacitor 22 is electrically charged.

After that, when the second transistor 14 changes to an off state, the electrically-charged capacitor 22 is discharged, and the gate capacitance of the first transistor 12 is charged. Because of the charging of the gate capacitance of the first transistor 12, a voltage required for the first transistor 12 to change from the off state to an on state is reduced to be low.

More specifically, the first transistor 12 shown in FIG. 4 changes from the off state to the on state even though the gate voltage is low as compared with that in the first transistor 12 shown in FIG. 3, Therefore, the power consumption of the power supply modulator 1 shown in FIG. 4 is less than that of the power supply modulator 1 shown in FIG. 3.

Embodiment 3

Figure 5:
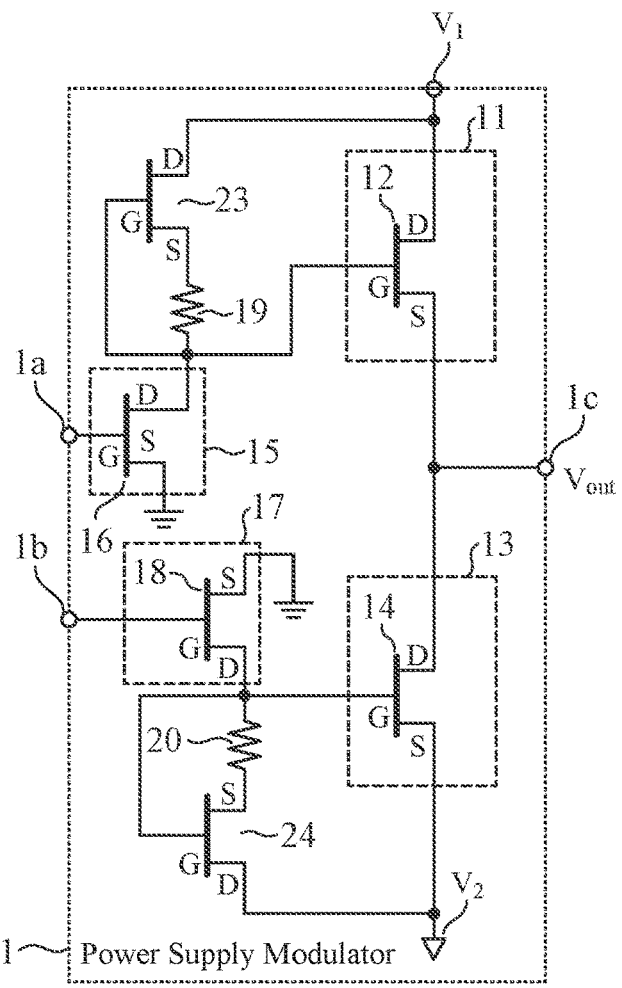
FIG. 5 is a schematic diagram showing a power supply modulator 1 according to Embodiment 3.

In Embodiment 3, a power supply modulator 1 including a fifth transistor 23 and a sixth transistor 24 will be explained. FIG. 5 is a schematic diagram showing the power supply modulator 1 according to Embodiment 3.

In FIG. 5, because the same reference signs as those shown in FIG. 2 denote the same components or like components as those shown in FIG. 2, an explanation of the components will be omitted hereinafter.

The source terminal of the fifth transistor 23 is connected to another end of a first resistor 19.

The drain terminal of the fifth transistor 23 is connected to the drain terminal of a first transistor 12.

The gate terminal of the fifth transistor 23 is connected to each of the following parts: an end of the first resistor 19, the drain terminal of a third transistor 16, and the gate terminal of the first transistor 12.

The source terminal of the sixth transistor 24 is connected to another end of a second resistor 20.

The drain terminal of the sixth transistor 24 is connected to the source terminal of a second transistor 14.

The gate terminal of the sixth transistor 24 is connected to each of the following parts: an end of the second resistor 20, the drain terminal of a fourth transistor 18, and the gate terminal of the second transistor 14.

Next, the operation of the power supply modulator 1 shown in FIG. 5 will be explained.

Because this power supply modulator 1 is the same as the power supply modulator 1 shown in FIG. 2, except for the fifth transistor 23 and the sixth transistor 24, only the operations of the fifth transistor 23 and the sixth transistor 24 will be explained hereinafter.

Each of the fifth and sixth transistors 23 and 24 is a normally-on transistor. In each of the fifth and sixth transistors 23 and 24, a value of resistance between the drain terminal and the source terminal changes in accordance with a voltage applied between the drain terminal and the source terminal. Therefore, in the power supply modulator 1 shown in FIG. 5, the time required for a change in the open or closed state of each of the first and second transistors 12 and 14 to change is reduced as compared with that of the power supply modulator 1 shown in FIG. 2.

Figure 6A:
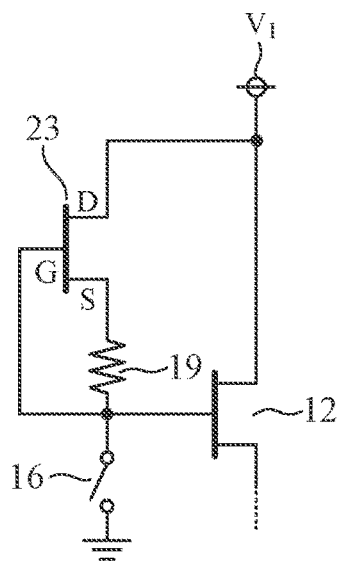
FIG. 6A is an explanatory drawing showing a part of the power supply modulator 1 when a third transistor 16 is in an off state.

FIG. 6A is an explanatory drawing showing a part of the power supply modulator 1 when the third transistor 16 is in an off state.

Figure 6B:
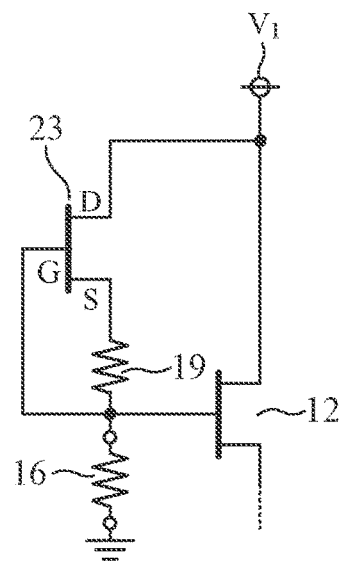
FIG. 6B is an explanatory drawing showing the part of the power supply modulator 1 at a state transition time when the third transistor 16 changes from the off state to an on state.

FIG. 6B is an explanatory drawing showing the part of the power supply modulator 1 at a state transition time when the third transistor 16 changes from the off state to an on state.

Figure 6C:
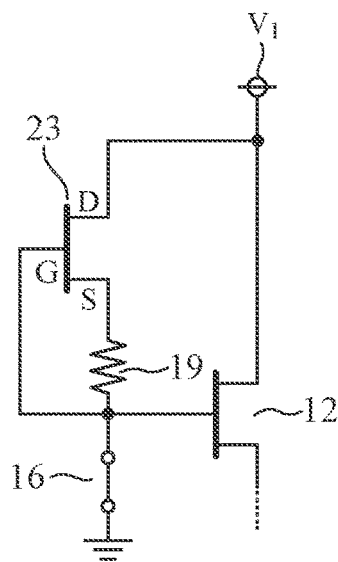
FIG. 6C is an explanatory drawing showing the part of the power supply modulator 1 when the third transistor 16 is in the on state.

FIG. 6C is an explanatory drawing showing the part of the power supply modulator 1 when the third transistor 16 is in the on state.

In FIG. 6A, the third transistor 16 when in the off state is shown as a switch in an open state. In FIG. 6B, the third transistor 16 when in the state transition is shown as a resistor. In FIG. 6C, the third transistor 16 when in the on state is shown as a switch in a closed state.

Figure 7:
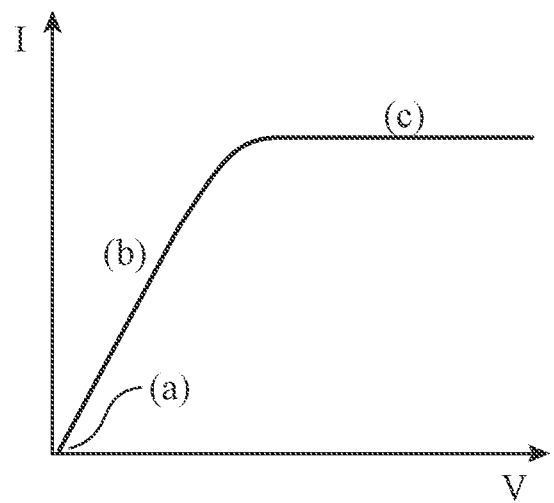
FIG. 7 is an explanatory drawing showing the current-voltage characteristics of a current control circuit including a first resistor 19 and a fifth transistor 23.

FIG. 7 is an explanatory drawing showing the current-voltage characteristics of a current control circuit including the first resistor 19 and the fifth transistor 23.

In FIG. 7, (a) shows the current and the voltage when the third transistor 16 is in the off state (FIG. 6A). (b) shows the current and the voltage when the third transistor 16 is in the state transition (FIG. 6B), (c) shows the current and the voltage when the third transistor 16 is in the on state (FIG. 6C).

When the third transistor 16 is in the off state, the current and the voltage of the current control circuit are as shown by (a) of FIG. 7, and a current hardly flows into the first resistor 19 and the fifth transistor 23.

When the third transistor 16 is in the state transition, the current and the voltage of the current control circuit are as shown by (b) of FIG. 7, and the current which flows into the first resistor 19 and the fifth transistor 23 increases with increase in the voltage.

When the third transistor 16 is in the on state, the current and the voltage of the current control circuit are as shown by (c) of FIG. 7, and the current which flows into the first resistor 19 and the fifth transistor 23 becomes saturated.

Therefore, when the third transistor 16 changes from the off state to the on state, the resistance value which the current control circuit including the first resistor 19 and the fifth transistor 23 has changes from a small value to a large value.

In contrast, when the third transistor 16 changes from the on state to the off state, the resistance value which the current control circuit including the first resistor 19 and the fifth transistor 23 has changes from the large value to the small value.

Because the current flowing into the gate terminal of the first transistor 12 increases when the resistance value which the current control circuit has changes from the large value to the small value, the change from the off state to the on state in the first transistor 12 becomes faster.

Because the current flowing into the gate terminal of the first transistor 12 decreases when the resistance value which the current control circuit has changes from the small value to the large value, the change from the on state to the off state in the first transistor 12 becomes faster.

FIG. 7 shows the current-voltage characteristics of the current control circuit including the first resistor 19 and the fifth transistor 23. The current-voltage characteristics of a current control circuit including the second resistor 20 and the sixth transistor 24 are also the same as the current-voltage characteristics of the current control circuit including the first resistor 19 and the fifth transistor 23.

Therefore, when the fourth transistor 18 changes from the off state to the on state, the resistance value which the current control circuit including the second resistor 20 and the sixth transistor 24 has changes from a small value to a large value.

In contrast, when the fourth transistor 18 changes from the on state to the off state, the resistance value which the current control circuit including the second resistor 20 and the sixth transistor 24 has changes from the large value to the small value.

Because the current flowing into the gate terminal of the second transistor 14 increases when the resistance value which the current control circuit including the second resistor 20 and the sixth transistor 24 has changes from the large value to the small value, the change from the off state to the on state in the second transistor 14 becomes faster.

Because the current flowing into the gate terminal of the second transistor 14 decreases when the resistance value which the current control circuit has changes from the small value to the large value, the change from the on state to the off state in the second transistor 14 becomes faster.

As mentioned above, in the power supply modulator 1 shown in FIG. 5, the time required for a change in the open or closed state of each of the first and second transistors 12 and 14 to change is reduced as compared with that in the power supply modulator 1 shown in FIG. 2.

In the power supply modulator 1 shown in FIG. 5, the drain terminal of the fifth transistor 23 is connected to the drain terminal of the first transistor 12. However, this is only an example, and the drain terminal of the fifth transistor 23 may be connected to the source terminal of the first transistor 12, as shown in FIG. 8.

Figure 8:
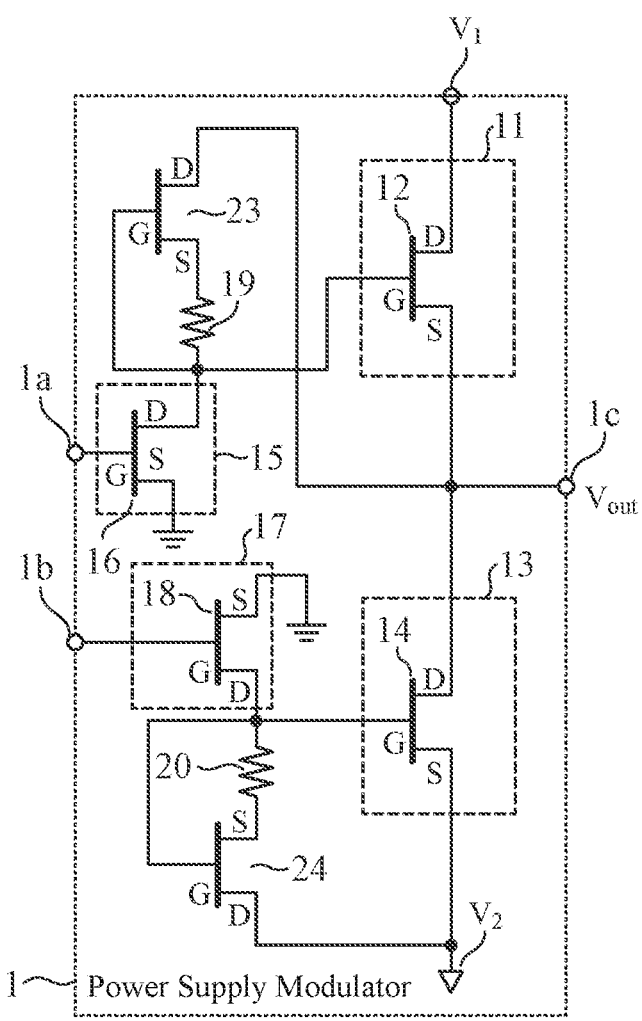
FIG. 8 is a schematic diagram showing another power supply modulator 1 according to Embodiment 3.

Also in the power supply modulator 1 shown in FIG. 8, when the third transistor 16 is in the on state, each of the first and fourth transistors 12 and 18 is in the off state, and the second transistor 14 is in the on state, like in the power supply modulator 1 shown in FIG. 5.

Further, when the third transistor 16 is in the off state, each of the first and fourth transistors 12 and 18 is in the on state, and the second transistor 14 is in the off state.

FIG. 8 is a schematic diagram showing another power supply modulator 1 according to Embodiment 3.

Embodiment 4

In the power supply modulator 1 shown in FIG. 8, each of the following parts: the drain terminal of a third transistor 16 and an end of a first resistor 19 is connected to the gate terminal of a first transistor 12.

In Embodiment 4, a power supply modulator 1 in which each of the following parts: the source terminal of a fifth transistor 23 and another end of a first resistor 19 is connected to the gate terminal of a first transistor 12 will be explained.

Figure 9:
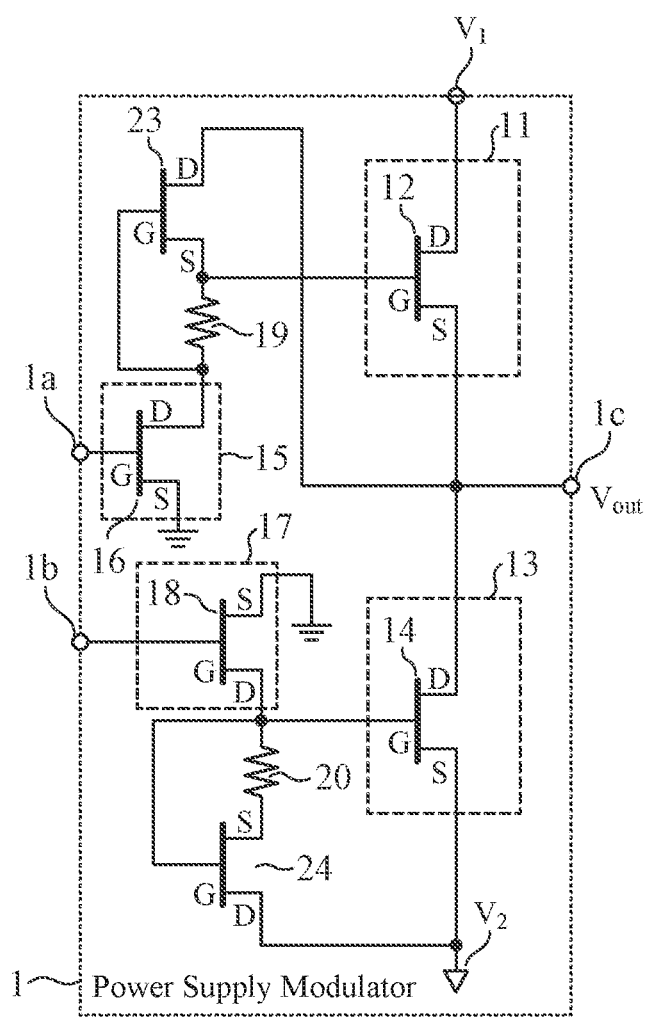
FIG. 9 is a schematic diagram showing a power supply modulator 1 according to Embodiment 4.

FIG. 9 is a schematic diagram showing the power supply modulator 1 according to Embodiment 4.

In the power supply modulator 1 shown in FIG. 8, resistance from the source terminal of the first transistor 12 to the gate terminal of the first transistor 12 corresponds to the on resistor of a fifth transistor 23 and the first resistor 19.

In the power supply modulator 1 shown in FIG. 9, resistance extending from the source terminal of the first transistor 12 to the gate terminal of the first transistor 12 corresponds to only the on resistor of the fifth transistor 23.

Therefore, in the power supply modulator 1 shown in FIG. 9, because the change of the value of the resistance from the source terminal of the first transistor 12 to the gate terminal of the first transistor 12 is large as compared with that in the power supply modulator 1 shown in FIG. 8, the time required for a change in the open or closed state of the first transistor 12 to change is reduced.

Embodiment 5

In Embodiment 5, a power supply modulator 1 including a diode 25 and a capacitor 26 will be explained.

Figure 10:
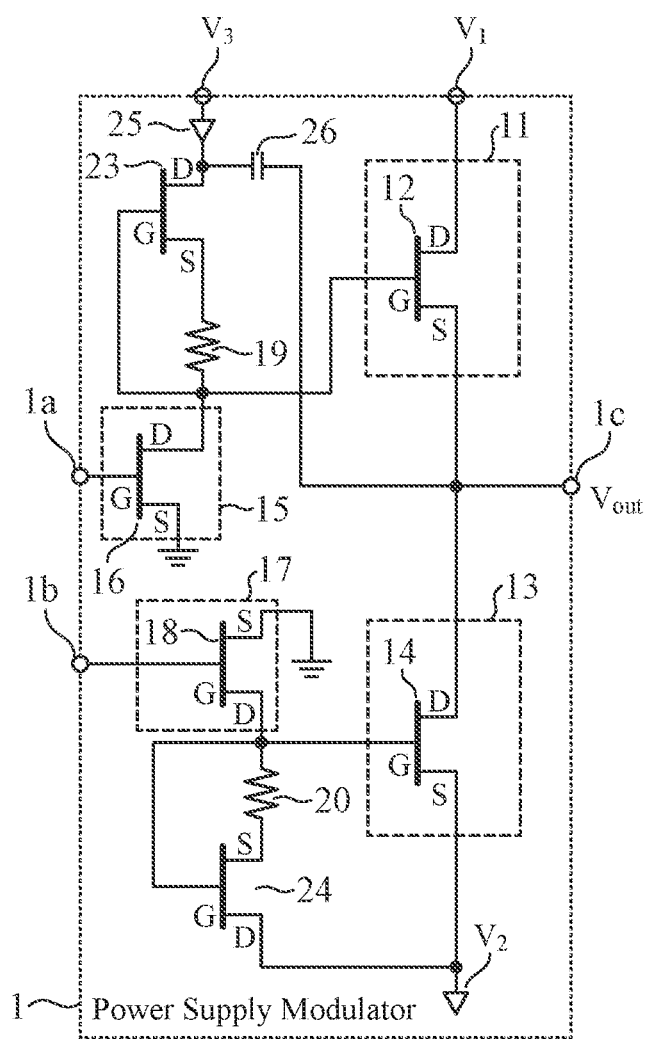
FIG. 10 is a schematic diagram showing a power supply modulator 1 according to Embodiment 5.

FIG. 10 is a schematic diagram showing the power supply modulator 1 according to Embodiment 5. In FIG. 10, because the same reference signs as those shown in FIGS. 2 and 9 denote the same components or like components as those shown in FIGS. 2 and 9, an explanation of the components will be omitted hereinafter.

A third voltage 6'3 is applied to the anode terminal of the diode 25. The cathode terminal of the diode 25 is connected to each of the following parts: the drain terminal of a fifth transistor 23 and an end of a capacitor 26.

The end of the capacitor 26 is connected to each of the following terminals: the drain terminal of the fifth transistor 23 and the cathode terminal of the diode 25.

Another end of the capacitor 26 is connected to each of the following terminals: the source terminal of a first transistor 12, the drain terminal of a second transistor 14, and an output terminal 1c.

Next, the operation of the power supply modulator 1 shown in FIG. 5 will be explained.

Because this power supply modulator is the same as the power supply modulator 1 shown in FIG. 9, except for the diode 25 and the capacitor 26, only the operations of the diode 25 and the capacitor 26 will be explained hereinafter.

Because the third voltage $V_3$ is applied to the anode terminal of the diode 25, a current flows into the second transistor 14 via the diode 25 and the capacitor 26 when the first transistor 12 is in an off state and the second transistor 14 is in an on state. At this time, the capacitor 26 is electrically charged.

After that, when the second transistor 14 changes to an off state, the electrically-charged capacitor 26 is discharged, and the gate capacitance of the first transistor 12 is charged. Because of the charging of the gate capacitance of the first transistor 12, a voltage required for the first transistor 12 to change from the off state to the on state is reduced to be low.

More specifically, the first transistor 12 shown in FIG. 10 changes from the off state to the on state even though the gate voltage is low as compared with that in the first transistor 12 shown in FIG. 9. Therefore, the power consumption of the power supply modulator 1 shown in FIG. 10 is less than that of the power supply modulator 1 shown in FIG. 9.

It is to be understood that an arbitrary combination of two or more of the above-mentioned embodiments can be made, various changes can be made in an arbitrary component according to any one of the above-mentioned embodiments, or an arbitrary component according to any one of the above-mentioned embodiments can be omitted within the scope of the present disclosure.

INDUSTRIAL APPLICABILITY

The present disclosure is suitable for a power supply modulator. The present disclosure is suitable for a power supply modulation type amplifier including a power supply modulator.

REFERENCE SIGNS LIST 1 power supply modulator, 1a, 1b input terminal, 1c output terminal, 2 LPF, 3 power amplifier, 11 first switching element, 12 first transistor, 13 second switching element, 14 second transistor, 15 first driver circuit, 16 third transistor, 17 second driver circuit, 18 fourth transistor, 19 first resistor, 20 second resistor, 21 diode, 22 capacitor, 23 fifth transistor, 24 sixth transistor, 25 diode, and 26 capacitor.

The invention claimed is:

1. A power supply modulator comprising:
a first switching element having a first terminal and a second terminal, a first voltage being applied to the first terminal and the second terminal being connected to an output terminal;
a second switching element having a third terminal and a fourth terminal, the third terminal being connected to each of the following terminals: the output terminal and the second terminal, and a second voltage lower than the first voltage being applied to the fourth terminal;
a first driver circuit having a fifth terminal and a sixth terminal, a third voltage being applied to the fifth terminal and the sixth terminal being grounded, to control opening and closing of the first switching element by means of a change in a value of resistance between the fifth terminal and the sixth terminal, the change depending on a signal level of a pulse width modulation signal; and
a second driver circuit having a seventh terminal and an eighth terminal, the seventh terminal being grounded and the second voltage being applied to the eighth terminal, to control opening and closing of the second switching element by means of a change in a value of resistance between the seventh terminal and the eighth terminal, the change depending on a signal level of an inverted signal of the pulse width modulation signal,
wherein
the first switching element is a first transistor,
the first terminal is a drain terminal of the first transistor, and the second terminal is a source terminal of the first transistor;
the second switching element is a second transistor,
the third terminal is a drain terminal of the second transistor, and the fourth terminal is a source terminal of the second transistor;
the first driver circuit is a third transistor,
the pulse width modulation signal is applied to a gate terminal of the third transistor,
the fifth terminal is a drain terminal of the third transistor, and the drain terminal of the third transistor is connected to a gate terminal of the first transistor, and
the sixth terminal is a source terminal of the third transistor; and
the second driver circuit is a fourth transistor,
the inverted signal of the pulse width modulation signal is applied to a gate terminal of the fourth transistor,
the seventh terminal is a source terminal of the fourth transistor, and
the eighth terminal is a drain terminal of the fourth transistor, and the drain terminal of the fourth transistor is connected to a gate terminal of the second transistor, and
wherein the power supply modulator further comprises:
a first resistor of which a first end is connected to each of the following terminals: the gate terminal of the first transistor and the drain terminal of the third transistor;
a diode in which a cathode terminal is connected to a second end of the first resistor, and the third voltage is applied to an anode terminal;
a capacitor of which a first end is connected to each of following parts: the second end of the first resistor and the cathode terminal of the diode, and of which a second end is connected to the source terminal of the first transistor; and
a second resistor of which a first end is connected to each of the following terminals: the gate terminal of the second transistor and the drain terminal of the fourth transistor, and of which a second end is connected to the source terminal of the second transistor.

2. A power supply modulation type amplifier comprising:
the power supply modulator according to claim 1;
a power amplifier to amplify a high frequency signal associated with the pulse width modulation signal; and
a low pass filter to generate a bias voltage to be applied to the power amplifier, from a voltage outputted from the output terminal of the power supply modulator.

* * * * *